United States Patent
Lim et al.

(10) Patent No.: US 10,074,426 B2
(45) Date of Patent: Sep. 11, 2018

(54) MEMORY DEVICE HAVING RESISTANCE CHANGE MATERIAL AND OPERATING METHOD FOR THE MEMORY DEVICE

(71) Applicant: SAMSUNG ELECTRONICS CO., LTD., Suwon-si, Gyeonggi-Do (KR)

(72) Inventors: Chea Ouk Lim, Hwaseong-si (KR); Hyun Kook Park, Anyang-si (KR); Jung Sunwoo, Seoul (KR); Young Hoon Oh, Hwaseong-si (KR); Yong Jun Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/677,052

(22) Filed: Aug. 15, 2017

(65) Prior Publication Data

US 2018/0197602 A1    Jul. 12, 2018

(30) Foreign Application Priority Data

Jan. 6, 2017  (KR) ........................ 10-2017-0002447

(51) Int. Cl.
*G11C 13/00* (2006.01)
*G06F 11/10* (2006.01)
*G11C 29/52* (2006.01)

(52) U.S. Cl.
CPC ...... *G11C 13/0069* (2013.01); *G06F 11/1068* (2013.01); *G11C 13/004* (2013.01); *G11C 13/0004* (2013.01); *G11C 29/52* (2013.01)

(58) Field of Classification Search
CPC . G11C 13/0069; G11C 29/52; G11C 13/0004; G11C 13/004; G06F 11/1068
See application file for complete search history.

(56) References Cited

U.S. PATENT DOCUMENTS

| | | | |
|---|---|---|---|
| 7,038,961 B2 | 5/2006 | Sakata et al. |
| 7,920,432 B2 | 4/2011 | Lee et al. |
| 7,924,601 B2 | 4/2011 | Aoki |
| 7,978,539 B2 | 7/2011 | Lee et al. |
| 7,996,735 B2 | 8/2011 | Terao et al. |
| 8,117,508 B2 | 2/2012 | Tokiwa |
| 8,174,876 B2 | 5/2012 | Lee |
| 8,223,527 B2 | 7/2012 | Lee et al. |

(Continued)

FOREIGN PATENT DOCUMENTS

KR    20160065661 A    6/2016

*Primary Examiner* — Mohammed A Bashar
(74) *Attorney, Agent, or Firm* — Volentine, Whitt & Francos, PLLC

(57) ABSTRACT

A memory device having a resistance change material and an operating method of the memory device are provided. A memory device includes a memory cell array including first and second resistive memory cells, which store different data according to the change of their resistance; a buffer including first and second storage regions corresponding to the first and second resistive memory cells, respectively; and a control circuit receiving program data to be programmed to the memory cell array, comparing first data stored in the first storage region and second data stored in the first resistive memory cell, and as a result of the comparison determining one of the first and second storage regions as a storage region to which to write the program data.

20 Claims, 20 Drawing Sheets

(56) References Cited

U.S. PATENT DOCUMENTS

| | | | |
|---|---|---|---|
| 8,250,289 B2 | 8/2012 | Ro et al. | |
| 8,467,237 B2 | 6/2013 | Bedeschi et al. | |
| 8,542,528 B2 | 9/2013 | Sekine et al. | |
| 8,649,212 B2 | 2/2014 | Kau et al. | |
| 9,021,227 B2 | 4/2015 | Karpov et al. | |
| 9,230,642 B2 | 1/2016 | Ryoo et al. | |
| 9,245,619 B2 | 1/2016 | Kim et al. | |
| 2010/0131708 A1* | 5/2010 | Park | G11C 13/0069 |
| | | | 711/115 |
| 2011/0055486 A1* | 3/2011 | Heo | G06F 12/0868 |
| | | | 711/128 |
| 2014/0157065 A1* | 6/2014 | Ong | G11C 29/12 |
| | | | 714/718 |

\* cited by examiner

Buffer Size ( tWTR=t2 )

Buffer Size ( tWTR=t3(<t2) )

< Case 1 >

< Case 2 >

MEMORY DEVICE HAVING RESISTANCE CHANGE MATERIAL AND OPERATING METHOD FOR THE MEMORY DEVICE

CROSS-REFERENCE TO RELATED APPLICATION

This application claims priority to Korean Patent Application No. 10-2017-0002447 filed on Jan. 6, 2017 in the Korean Intellectual Property Office, and all the benefits accruing therefrom under 35 U.S.C. § 119, the disclosure of which is incorporated herein by reference in its entirety.

BACKGROUND

The present disclosure relates to a memory device having a resistance change material and an operating method for the memory device.

Examples of a nonvolatile memory device using a resistance material include a Phase-change Random Access Memory (PRAM), a Resistive Random Access Memory (RRAM), and a Magnetic Random Access Memory (MRAM). A Dynamic Random Access Memory (DRAM) or a flash memory device stores data using electric charges, whereas the non-volatile memory device using a resistance material stores data using a change in the state of a phase-change material, such as a chalcogenide alloy (in the case of a PRAM), a change in the resistance of a variable resistor (in the case of an RRAM), or a change in the resistance of a Magnetic Tunnel Junction (MTJ) thin film depending on the magnetization state of a ferromagnetic material (in the case of an MRAM).

SUMMARY

Example embodiments of the present disclosure provide a memory device which can be miniaturized and can process data at high speed.

Example embodiments of the present disclosure also provide a small-size memory device which can secure the reliability of data input and output regardless of a resistance drift phenomenon.

Example embodiments of the present disclosure also provide an operating method of a small-size memory device which can secure the reliability of data input and output regardless of a resistance drift phenomenon.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to an example embodiment of the present disclosure, there is provided a memory device, including a memory cell array including at least a first resistive memory cell and a second resistive memory cell, wherein the first resistive memory cell and the second resistive memory cell each include a resistive change material and are each configured to store different data according to a value of their resistance; a buffer including a first storage region and a second storage region corresponding to the first resistive memory cell and the second resistive memory cell, respectively; and a control circuit configured to receive program data to be programmed to the memory cell array, to compare first data stored in the first storage region and second data stored in the first resistive memory cell, and in response to comparing the first data and the second data to determine one of the first storage region and the second storage region as a selected storage region to which to write the program data.

According to still another example embodiment of the present disclosure, there is provided a method of operating a memory device, including receiving program data; reading first data stored in a first storage region of a buffer of the memory device, wherein the first storage region is pointed to by a write pointer; reading second data stored in a first resistive memory cell of the memory device, which corresponds to the first storage region and stores different data according to a value of its resistance; comparing the first data and the second data; and writing the program data to the first storage region when comparing the first data and the second data produces a first result, and controlling the write pointer to point to a second storage region of the buffer, which is different from the first storage region, when comparing the first data and the second data produces a second result, which is different from the first result.

According to still another example embodiment of the present disclosure, there is provided method of operating a memory device, including receiving program data; reading first data stored in the first storage region of a buffer of the memory device, wherein the buffer includes the first storage region and a second storage region separate from the first storage region; reading second data stored in a first resistive memory cell of a memory cell array of the memory device, wherein the first resistive memory cell corresponds to the first storage region and stores different data according to a value of its resistance; comparing the first data and the second data; and writing the program data to the first storage region when comparing the first data and the second data produces a first result, and writing the program data to the second storage region when comparing the first data and the second data produces a second result, which is different from the first result.

According to yet another aspect of the invention, a memory device includes: a memory cell array including a plurality of resistive memory cells which each include a resistance change material and which are configured to store different data according to a value of their resistance; a buffer including a plurality of storage regions; and a control circuit configured to receive program data to be programmed to the memory cell array, and further configured such that, in response to the program data, when a write pointer points to a first storage region among the plurality of storage regions, the control circuit determines whether the first region is empty, and when the first region is empty the control circuit writes the program data to the first region and to a first resistive memory cell among the plurality of resistive memory cells, wherein the first resistive memory cell corresponds to the first storage region of the buffer, and when the first region is not empty the control circuit compares first data stored in the first storage region and second data stored in the first resistive memory cell, and in response to comparing the first data and the second data, determines whether to write the program data to the first storage region and the first resistive memory cell.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail example embodiments thereof with reference to the attached drawings, in which.

DETAILED DESCRIPTION

As is traditional in the field of the inventive concepts, one or more elements of embodiments may be described and illustrated in terms of functional blocks, units and/or modules. These blocks, units and/or modules are physically implemented by electronic circuits such as logic circuits, microprocessors, hard-wired circuits or the like, and may optionally be driven by firmware and/or software. Also, each functional block, unit and/or module of the embodiments may be physically separated into two or more interacting and discrete blocks, units and/or modules without departing from the scope of the inventive concepts. Further, two or more of the functional blocks, units and/or modules of the embodiments may be physically combined into more complex blocks or units without departing from the scope of the inventive concepts.

Figure 1:
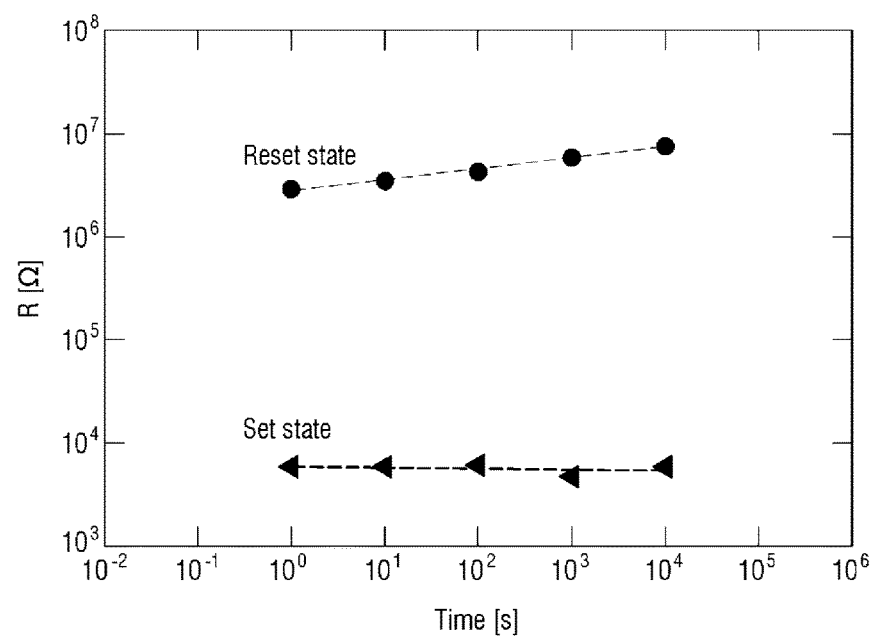
FIG. 1 illustrates a resistance drift phenomenon.

FIG. 1 illustrates a resistance drift phenomenon. Specifically, FIG. 1 is a graph showing the change of the resistance of a phase-change material over time. More specifically, FIG. 1 is a graph showing the change of the resistance of a phase-change material in a reset state over time, and the change of the resistance of a phase-change material in a set state over time.

A phase-change memory cell having a phase-change material, among other resistive memory cells (RMCs) storing different data according to their resistance, may store different data depending on the resistance of the phase-change material.

The phase-change material turns into a crystalline state as it slowly cools down after being heated, or turns into an amorphous state as it rapidly cools down. The phase-change material has low resistance in the crystalline state and has high resistance in the amorphous state. Thus, the phase-change material in the crystalline state may be defined as, for example, set data or "zero" data, and the phase-change material in the amorphous data may be defined as, for example, reset data or "one" data.

In a case in which the phase change material reaches the amorphous state due to heat, there may exist structural defects in the phase change material. The structural defects may be cured by a structural relaxation process. As the structural defects are cured, a resistance drift phenomenon, which is a phenomenon in which the resistance of the phase-change material in the reset state increases, may occur, as illustrated in FIG. 1.

Figure 2:
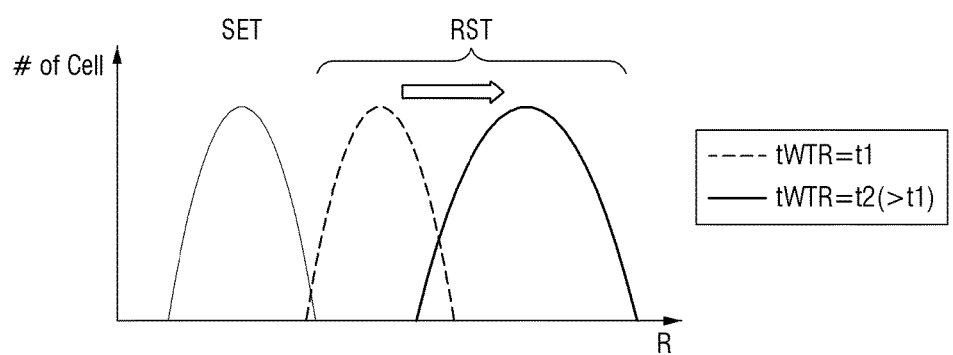
FIG. 2 illustrates the change of the distribution of resistive memory cells according to the resistance drift phenomenon illustrated in FIG. 1.

FIG. 2 illustrates the change of the distribution of resistive memory cells according to the resistance drift phenomenon illustrated in FIG. 1.

The resistance drift phenomenon may change the distribution of resistive memory cells, as illustrated in FIG. 2. Specifically, referring to FIG. 2, the distribution of resistive memory cells having a phase-change material in a set state "SET" (hereinafter referred to as the set-state resistive memory cells) does not change much over time, but the distribution of resistive memory cells having a phase change material in a reset state "RST" (hereinafter referred to as the reset-state resistive memory cells) may considerably change over time.

The amount of time spent after a phase change material included in each resistive memory cell reaches the amorphous state may be defined as a stabilization time tWTR. Referring to FIG. 2, it may be understood that a change of the distribution of the reset-state resistive memory cells occurs in response to the stabilization time tWTR changing from t1 to t2, which is longer than t1. Here, t2 may be defined as a time which is sufficient to ensure that the resistance of a defined percentage of reset-state resistive memory cells will have reached a defined percentage of its final value.

Due to the resistance drift phenomenon, an error may unexpectedly occur depending on when data is read from the reset-state resistive memory cells.

For example, if a read operation is performed when the resistance drift phenomenon in the reset-state resistive memory cells has not progressed sufficiently, reset data may not be able to be read correctly from the reset-state resistive memory cells.

A method to overcome this problem is to give sufficient time for the resistive drift phenomenon to occur in the reset-state resistive memory cells, and this method will hereinafter described with reference to FIGS. 3 and 4.

Figure 3:
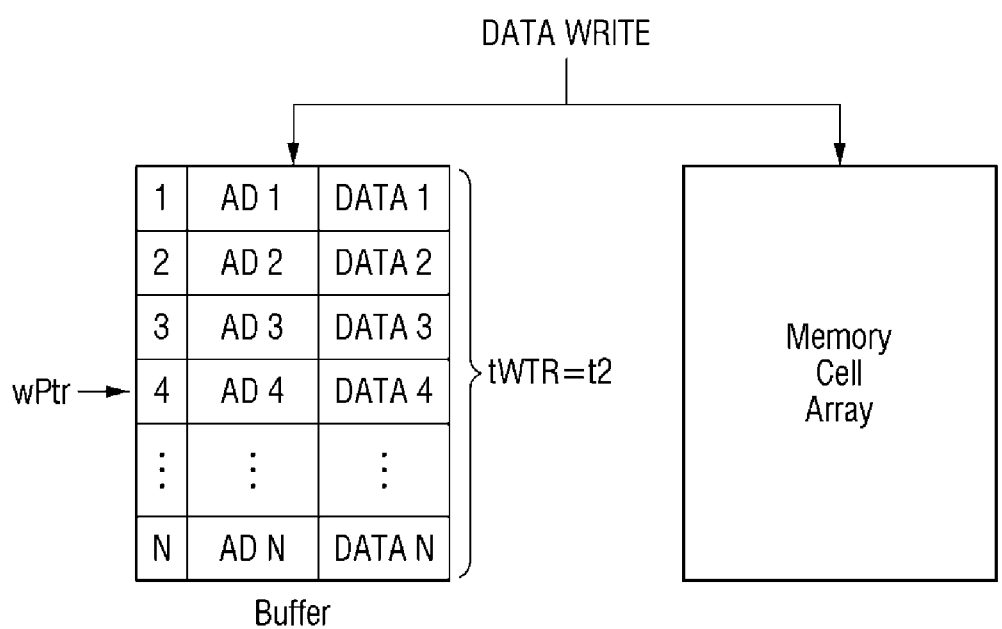
FIG. 3 illustrates a writing method of a memory device according to some example embodiments of the present disclosure, in which the resistance drift phenomenon illustrated in FIG. 1 is taken into consideration.

FIG. 3 illustrates a writing method of a memory device according to some example embodiments of the present disclosure, in which the resistance drift phenomenon illustrated in FIG. 1 is taken into consideration.

Referring to FIG. 3, when program data is written to a memory cell array including a plurality of resistive memory cells, the program data may also be written to a buffer (or a buffer memory). Specifically, when the program data is written to the memory cell array, the program data may also be written to the buffer, particularly, to a storage region pointed to by a write pointer wPtr of the buffer. More specifically, when the program data is written to a resistive memory cell having a predetermined address, the predetermined address and the program data may be written to the storage region pointed to by the write pointer wPtr of the buffer.

The size, or length, of the buffer may be established such that a stabilization time tWTR which is as long as t2 can be secured, given the data rate at which data is written into the memory cell array and buffer. The write pointer wPtr of the buffer may sequentially point to first through N-th storage regions 1 through N of the buffer so that data can be sequentially written to the buffer. Thereafter, the write pointer wPtr of the buffer may point again to the first storage region 1 so that the buffer can operate in a First In First Out (FIFO) manner.

Program data stored in both the memory cell array and the buffer at the same time in the aforementioned manner may be data that has failed to secure a stabilization time tWTR which is as long as t2. On the other hand, program data stored in the memory cell array, but not in the buffer, may be data that has successfully secured a stabilization time tWTR which is as long as t2.

Specifically, the write pointer wPtr of the buffer may point to the first storage region 1 when data is yet to be stored in both the buffer and the memory cell array, and in response to the location pointed to by the write pointer wPtr being the first storage region 1, first data "DATA 1" having a first address "AD 1" may be written to both the first storage region 1 and to a resistive memory cell of the memory cell array that can be accessed with the first address "AD 1".

Thereafter, the write pointer wPtr of the buffer may sequentially point to the second through N-th storage regions 2 through N so that second through N-th data "DATA 2" through "DATA N" having second through N-th addresses "AD 2" through "AD N", respectively, can be sequentially stored in the buffer. The second through N-th data "DATA 2" through "DATA N" may also be stored in resistive memory cells, respectively, of the memory cell array that can be accessed with the second through N-th addresses "AD 2" through "AD N", respectively.

Thereafter, when the write pointer wPtr of the buffer points again to the first storage region 1 due to the buffer being full of data, the first data "DATA 1" may be in a state in which a stabilization time tWTR which is as long as t2 has already been secured, because the size of the buffer is sufficiently large to secure as long a stabilization time tWTR as t2, given the data rate at which data is written into the memory cell array and buffer.

Thus, the first data "DATA 1" stored in the resistive memory cell of the memory cell array that can be accessed with the first address "AD 1" may be in a state in which the resistance drift phenomenon has sufficiently progressed, even if it is reset data. Accordingly, the buffer no longer needs to maintain the first data "DATA 1" stored in the first storage region 1. Therefore, new program data may be written to the first storage region 1 of the buffer.

Figure 4:
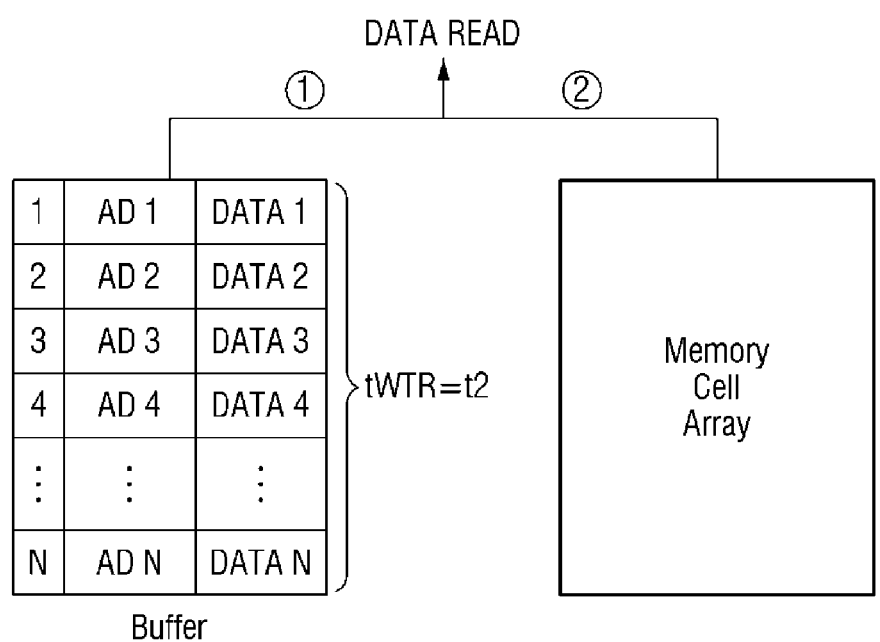
FIG. 4 illustrates a reading method of a memory device according to some example embodiments of the present disclosure, in which the resistance drift phenomenon illustrated in FIG. 1 is taken into consideration.

FIG. 4 illustrates a reading method of a memory device according to some example embodiments of the present disclosure, in which the resistance drift phenomenon illustrated in FIG. 1 is taken into consideration.

Referring to FIG. 4, in order to read data from a predetermined address, a determination is made as to whether the predetermined address exists in the buffer. In response to a determination being made that the predetermined address exists in the buffer, data is read from the buffer (①). On the other hand, in response to a determination being made that the predetermined address does not exist in the buffer, data may be read from the memory cell array (②).

As described above, program data stored in both the memory cell array and the buffer may be data that has failed to secure a stabilization time tWTR which is as long as t2, in which case, the reliability of a read operation may be improved by reading the program data from the buffer.

On the other hand, program data stored in the memory cell array, but not in the buffer, may be data that has successfully secured a stabilization time tWTR which is as long as t2, in which case, the program data may be read from the memory cell array.

Write and read methods illustrated in FIGS. 3 and 4 require a buffer having a sufficiently large size to secure a stabilization time tWTR which is as long as t2. Accordingly, as the data processing capacity per unit time (for example, the bandwidth or data write speed) of a memory element increases, the size of the buffer should increase accordingly.

However, in a case in which the buffer is implemented using a Static Random Access memory (SRAM), the area occupied by the buffer in the memory element increases. Thus, as the data processing capacity per unit time (for example, the bandwidth) of the memory element increases, the size of the memory element may also increase.

Figure 5:
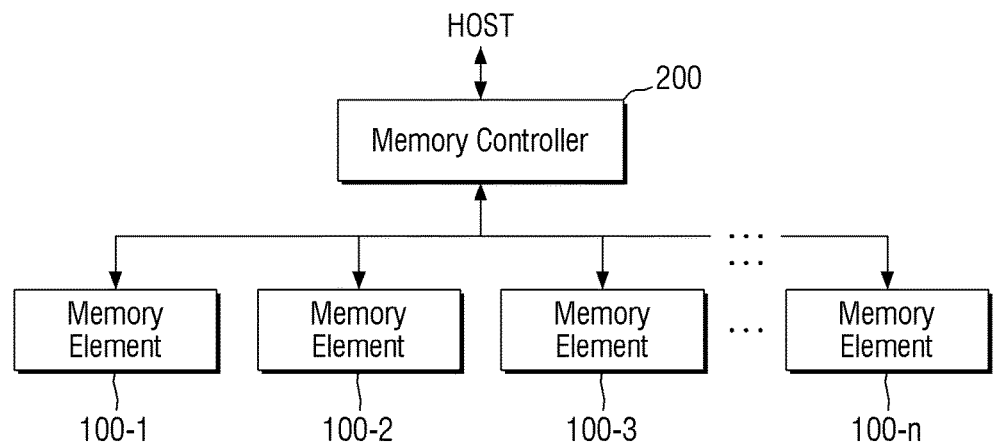
FIG. 5 is a block diagram of a memory device according to some example embodiments of the present disclosure.

FIG. 5 is a block diagram of a memory device according to some example embodiments of the present disclosure.

Referring to FIG. 5, the memory device includes a memory controller 200 and a plurality of memory elements 100-1 through 100-$n$.

In response to a read request or a write request being received from a host "HOST", memory controller 200 controls memory elements 100-1 through 100-$n$ such that data can be read from, or written to, memory elements 100-1 through 100-$n$.

Specifically, memory controller 200 may provide addresses, commands, and control signals to memory elements 100-1 through 100-$n$ and may thus control a program (or write) operation, a read operation, and an erase operation performed on memory elements 100-1 through 100-$n$.

Memory controller 200 may provide program data to be written to memory elements 100-1 through 100-$n$ via an input/output (I/O) data line, and may provide data read from memory elements 100-1 through 100-$n$ to memory controller 200 via the I/O data line. Memory controller 200 may provide addresses, commands, and control signals to memory elements 100-1 through 100-$n$ via a control line.

Memory controller 200 and memory elements 100-1 to 100-$n$ may be integrated into a single semiconductor device. For example, memory controller 200 and memory elements 100-1 to 100-$n$ may be integrated into a single memory card. For example, memory controller 200 and memory elements 100-1 to 100-$n$ may be integrated into a single semiconductor device to configure a memory card, such as a PC card (e.g., a Personal Computer Memory Card International Association (PCMCIA) card), a Compact Flash (CF) card, a smart media card (SM or SMC), a memory stick, a multimedia card (MMC, RS-MMC, MMCmicro), an SD card (SD, miniSD, microSD, or SDHC), a Universal Flash Storage device (UFS), or the like. For example, memory controller 200 and memory elements 100-1 through 100-$n$ may be integrated into a single semiconductor device to configure a Solid State Disk/Drive (SSD).

Figure 6:
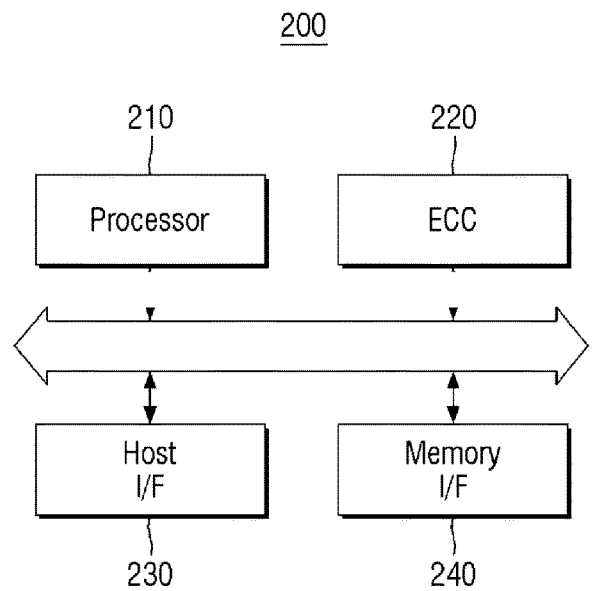
FIG. 6 is a detailed block diagram of the memory controller of FIG. 5.

FIG. 6 is a detailed block diagram of the memory controller of FIG. 5.

Referring to FIG. 6, memory controller 200 may include a processor 210, an Error Correction Code (ECC) unit 220, a host interface 230, and a memory interface 240.

Processor 210 may control the overall operation of memory controller 200. For example, processor 210 may control various functional blocks associated with various operations to be performed on memory elements 100-1 through 100-n of FIG. 5.

ECC unit 220 may perform ECC encoding on program data and may perform ECC decoding on read data. For example, ECC unit 220 may detect one or more errors from data read from memory elements 100-1 through 100-n and may perform error correction on the read data.

ECC unit 220 may perform ECC encoding and ECC decoding using an algorithm such as, for example, a Reed-Solomon (RS) code, a Hamming code, a Cyclic Redundancy Code (CRC), etc. ECC encoding may include generating a parity bit based on data to be programmed, and ECC decoding may include correcting any detected error bit. For example, ECC unit 220 may detect an error bit by comparing a parity bit generated and stored when programming data and a parity bit generated when reading the data, and may correct the detected error bit by performing a predetermined logic operation (for example, an eXclusive OR (XOR) operation) on the detected error bit.

ECC unit 220 may be set to have a predetermined error correction rate. The higher the error correction rate of ECC unit 220, the greater the number of parity bits generated for each data of a given size. For example, as the error correction rate of ECC unit 220 increases, the number of bits that can be error-corrected per data size (or per ECC unit) increases.

Host interface 230 may interface with the host "HOST" of FIG. 5 to receive operation requests for memory elements 100-1 through 100-n of FIG. 5 from the host "HOST". For example, host interface 230 may receive various requests such as read and write requests from the host "HOST" in FIG. 5, and may generate various internal signals for controlling memory elements 100-1 through 100-n in response to the receipt of various requests.

Memory interface 260 may perform interfacing for exchanging various signals (for example, commands, addresses, mode signals, and reference information) generated in memory controller 200 with memory elements 100-1 to 100-n.

Figure 7:
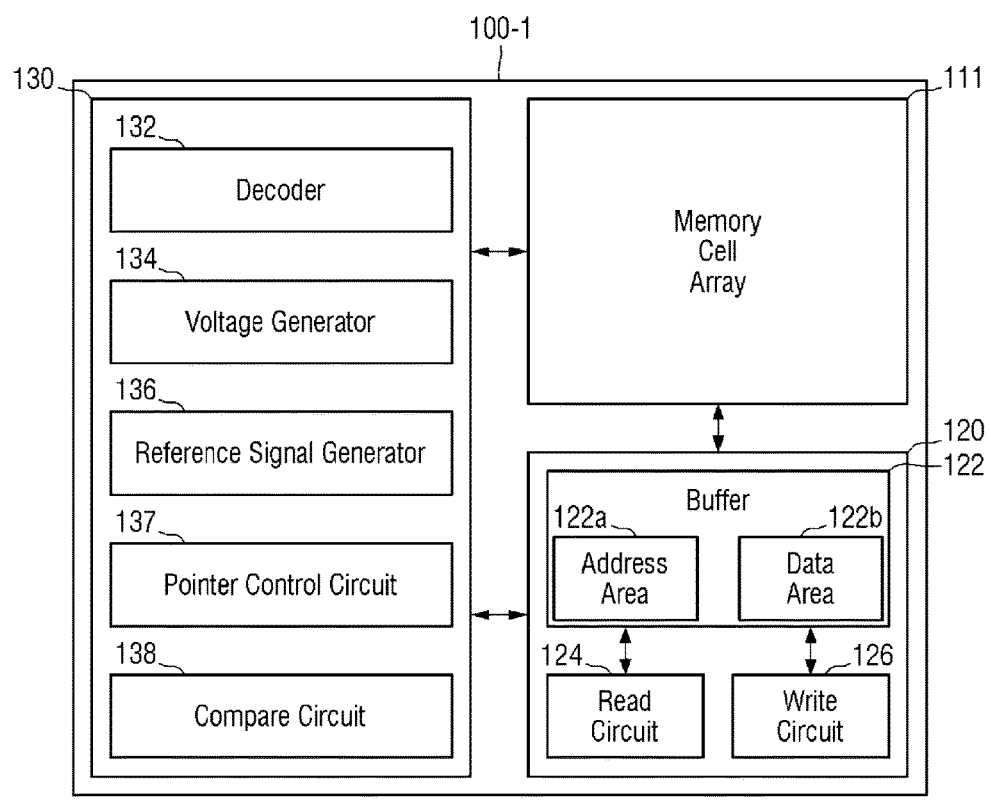
FIG. 7 is a detailed block diagram of a memory element of FIG. 5.
Figure 8:
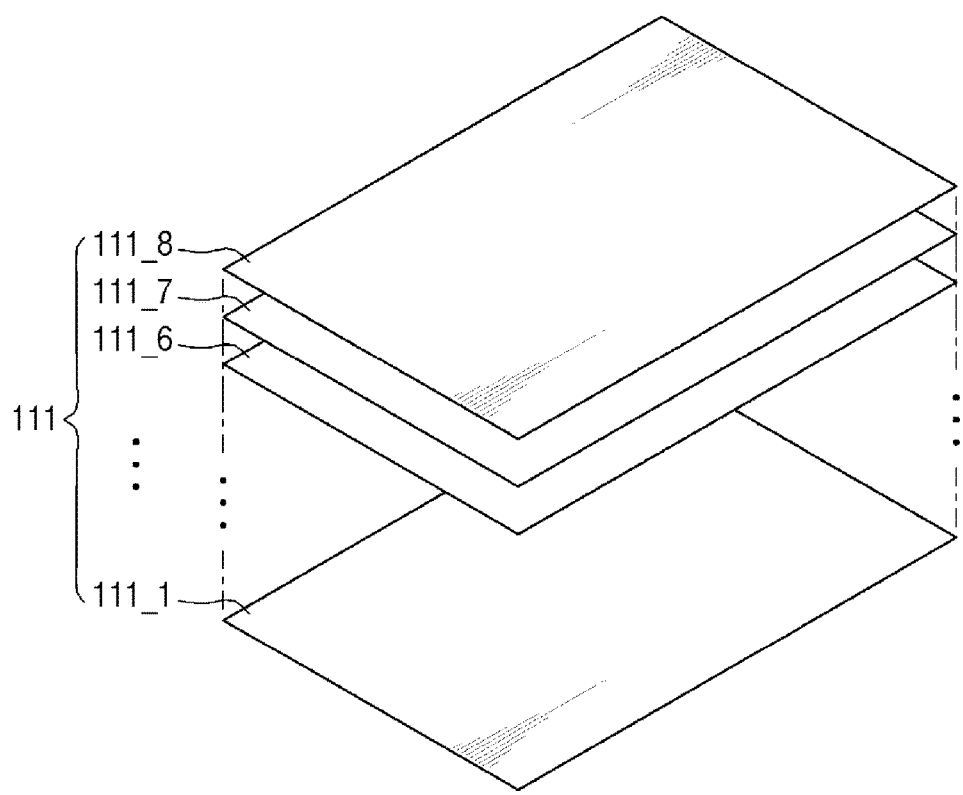
FIGS. 8, 9 and 10 illustrate a memory cell array of FIG. 7.
Figure 9:
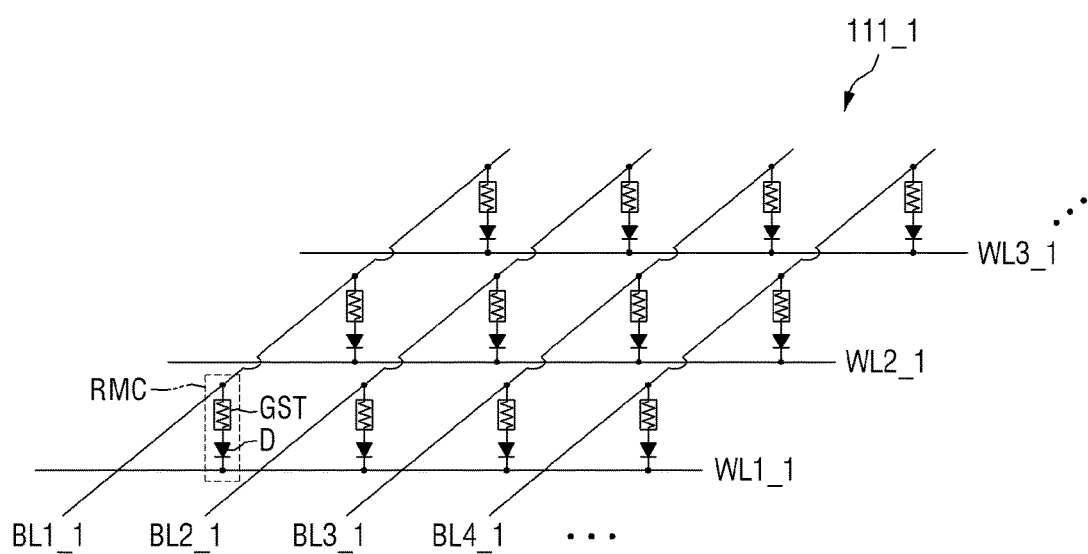
Figure 10:
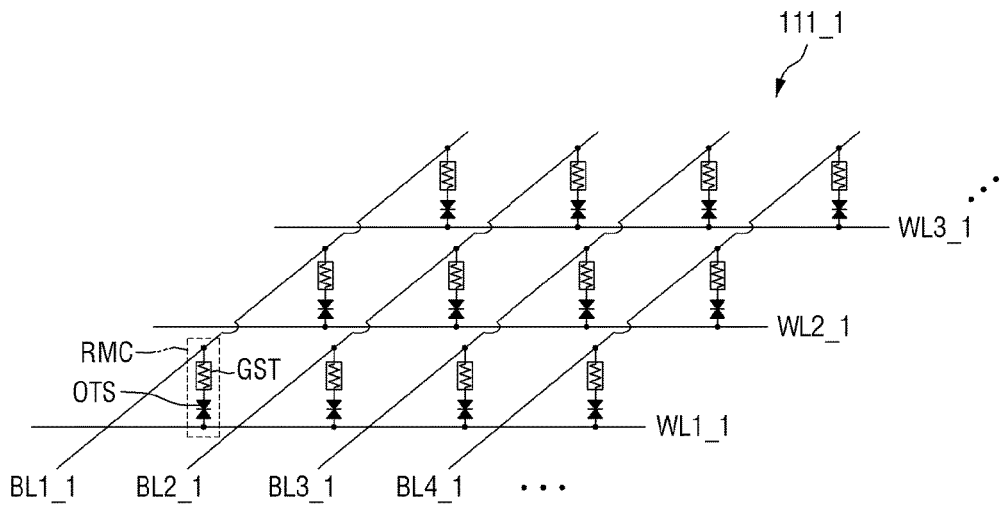
Figure 11:
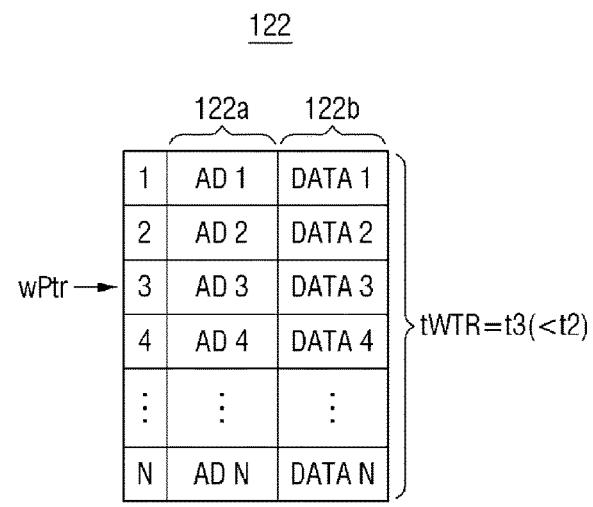
FIG. 11 illustrates a buffer of FIG. 7.

FIG. 7 is a detailed block diagram of a memory element of FIG. 5. FIGS. 8 through 10 illustrate a memory cell array of FIG. 7. FIG. 11 illustrates a buffer of FIG. 7.

Referring to FIG. 7, memory element 100-1 may include a memory cell array 111, a read/write circuit 120, and a control circuit 130.

Memory cell array 111 may include a plurality of resistive memory cells, which store different data according to the change of their resistance.

Specifically, referring to FIG. 8, memory cell array 111 may have, for example, a three-dimensional (3D) stack structure. That is, memory cell array 111 may have, for example, a vertical stack of a plurality of memory cell layers 111_1 through 111_8. Memory cell array 111 is illustrated in FIG. 8 as having a vertical stack of eight memory cell layers 111_1 through 111_8, but the present disclosure is not limited thereto.

Each of memory cell layers 111_1 through 111_8 may include a plurality of groups of resistive memory cells and/or a plurality of groups of redundancy memory cells. In a case in which memory cell array 111 has a 3D stack structure, each of memory cell layers 111_1 through 111_8 may have a cross-point structure that will be described later, but the present disclosure is not limited thereto.

Referring to FIG. 9, memory cell layer 111_1 may have a cross-point structure. The cross-point structure may be a structure in which resistive memory cells RMC are respectively formed at the intersections between bitlines BL1_1 through BL4_1 and wordlines WL1_1 through WL3_1. Specifically, the bitlines BL1_1 through BL4_1 may extend in a first direction, the wordlines WL1_1 through WL3_1 may extend in a second direction to intersect the bitlines BL1_1 through BL4_1, and the resistive memory cells RMC may be respectively formed at the intersections between the bitlines BL1_1 through BL4_1 and the wordlines WL1_1 through WL3_1.

In some example embodiments, the resistive memory cells RMC may be Single-Level Cells (SLCs) capable of storing only one bit. In other example embodiments, the resistive memory cells RMC may be Multi-Level Cells (MLCs) capable of storing at least two bits. In other example embodiments, some resistive memory cells RMC are SLCs, and other resistive memory cells RMC may be MLCs.

In a case in which one-bit data is written to the resistive memory cells RMC, the resistive memory cells RMC may have, for example, two distributions of resistance levels, depending on the data written thereto. In a case in which two-bit data is written to the resistive memory cells RMC, the resistive memory cells RMC may have, for example, four distributions of resistance levels, depending on the data written thereto. In a case in which three-bit data is written to the resistive memory cells RMC, the resistive memory cells RMC may have, for example, eight distributions of resistance levels, depending on the data written thereto.

In a case in which the resistive memory cells RMC are Phase-change Random Access Memories (PRAMs), each of the resistive memory cells RMC may include a variable resistance element GST, which comprises a phase-change material, and an access element D, which controls the current that flows in the variable resistance element GST.

Referring to FIG. 9, in each of the resistive memory cells RMC, the access element D may be a diode or a transistor (not illustrated) connected in series to the variable resistance element GST.

Examples of the phase-change material include a compound of two elements such as GaSb, InSb, InSe, $Sb_2Te_3$, or GeTe, a compound of three elements such as GeSbTe, GaSeTe, InSbTe, $SnSb_2Te_4$, or InSbGe, or a compound of four elements such as AgInSbTe, (GeSn)SbTe, GeSb(SeTe), or $Te_{81}Ge_{15}Sb_2S_2$. In some example embodiments, GeSbTe, which is composed of germanium (Ge), antimony (Sb), and tellurium (Te), may be used as the phase-change material.

In a case in which the resistive memory cells RMC are Resistive Random Access Memories (RRAMs), the variable resistance element GST of each of the resistive memory cells RMC may comprise a complex metal oxide. In a case in which the resistive memory cells RMC are RRAMs, the resistive memory cells RMC may comprise, for example, NiO or perovskite. The perovskite may be a composition, such as manganite ($Pr_{0.7}Ca_{0.3}MnO_3$, $Pr_{0.5}Ca_{0.5}MnO_3$, other PCMO, LCMO, and the like), titernate (STO:Cr), or zirconate (SZO:Cr, $Ca_2Nb_2O_7$:Cr, and $Ta_2O_5$:Cr). A filament may be formed in the variable resistance element GST of each of the resistive memory cells RMC and may become a current path for a cell current that penetratingly flows through each of the resistive memory cells RMC. In some example embodiments, in a case in which the resistive memory cells RMC are RRAMs, the access element D may not be provided in each of the resistive memory cells RMC.

In a case in which the resistive memory cells RMC are Magnetic Random Access Memories (MRAMs), the variable resistance element GST of each of the resistance memory cells RMC may include upper and lower electrodes of a magnetic body and a dielectric body disposed between the upper and lower electrodes of the magnetic body.

In the description that follows, it is assumed that the resistive memory cells RMC are PRAMs, but the present disclosure is not limited thereto.

Referring to FIG. 10, in each of the resistive memory cells RMC, an Ovonic Threshold Switch (OTS), which controls the current that flows in the variable resistance element GST, may be used as the access element D.

Referring again to FIG. 7, read/write circuit 120 may perform write and read operations on the resistive memory cells RMC of FIG. 9, which are included in memory cell array 111. Read/write circuit 120 may be connected to memory cell array 111 via a plurality of bitlines, and may include a write circuit 126, which writes program data to the resistive memory cells RMC, and a read circuit 124, which senses the resistance of the resistive memory cells RMC.

Read/write circuit 120 may further include a buffer 122, and the same read and write operations as those performed on memory cell array 111 are performed on buffer 122. When program data is written to memory cell array 111, the same program data may also be written to buffer 122, and when data stored in memory cell array 111 is read using a predetermined address, data may also be read from buffer 122 using the same address.

Buffer 122 may include address areas 122a and data areas 122b. In some example embodiments, address areas 122a may include, for example, Content Addressable Memories (CAMs), and data areas 122b may include, for example, Static Random Access Memories (SRAMs).

Referring to FIG. 11, the size of buffer 122 may be smaller than the buffer size described above with reference to FIGS. 3 and 4. Specifically, assuming that the memory element described above with reference to FIGS. 3 and 4 includes a buffer capable of securing a stabilization time tWTR which is as long as t2 while processing K-bit data per unit time, given the data rate at which data is written into the memory cell array and buffer, then memory element 100-1 may include a buffer 122 capable of securing a stabilization time tWTR which is only as long as t3, which is shorter than t2, while processing K-bit data per unit time, given the data rate at which data is written into memory cell array 111 and buffer 122.

Accordingly, the memory device according to the example embodiment of FIGS. 5 and 7 can reduce the size of memory element 100-1 and can process data at high speed, and this will be described later in detail.

Referring again to FIG. 7, control circuit 130 may control the overall operation of memory element 100-1. Control circuit 130 may also control read/write circuit 120 to allow memory element 100-1 to perform read and write operations. For example, in order for memory element 100-1 to perform read and write operations, control circuit 130 may provide various signals such as read and write signals to read/write circuit 120, and read/write circuit 120 may provide a read current (or a read voltage) or a write current (or a write voltage) to memory cell array 111 according to the various signals provided by control circuit 130.

Specifically, control circuit 130 may receive a read command and an address from, for example, memory controller 200 of FIG. 5, and may read data from buffer 122 and memory cell array 111 via read circuit 124. Also, control circuit 130 may receive a write command, program data, and an address from, for example, memory controller 200, and may write the program data to buffer 122 and memory cell array 111 via write circuit 126.

Each of the resistive memory cells RMC of memory cell array 111 may have different resistance levels depending on the data stored therein, and the resistance of each of the resistive memory cells RMC may vary depending on program data to be written thereto.

A write operation may be classified or divided into a reset write operation or a set write operation. The resistive memory cells RMC may have a relatively low resistance level in the set state and may have a relatively high resistance level in the reset state. The reset write operation may be a write operation performed to increase the resistance of the resistive memory cells RMC, and the set write operation may be a write operation performed to lower the resistance of the resistive memory cells RMC.

Memory cell array 111 may be divided into, for example, pages, and each of the pages may include a plurality of resistive memory cells RMC. Each of the pages is connected to the same signal line (for example, the same wordline), and may thus be defined as a set of resistive memory cells RMC that can be accessed with a single row address.

Each of the pages may include a plurality of cell regions. For example, in a case in which each of the pages has a size of 8 KB, each of the pages may have four cell regions having a size of 2 KB. In some example embodiments, cell regions may be defined as the units of error detection and correction, i.e., the units of ECC.

Control circuit 130 is illustrated in FIG. 7 as including a decoder 132, a voltage generator 134, a reference signal generator 136, a pointer control circuit 137, and a comparison circuit 138, but the present disclosure is not limited thereto.

Decoder 132 may include, for example, a row decoder and a column decoder. The row decoder may select a wordline of memory cell array 111 in response to a row address, and the column decoder may select a bitline of memory cell array 111 in response to a column address.

During a write operation, voltage generator 134 may generate a set voltage Vset or a reset voltage Vreset and may provide the set voltage Vset or the reset voltage Vreset to a selected resistive memory cell RMC of memory cell array 111. During a read operation, voltage generator 134 may provide a read voltage Vread to the selected resistive memory cell RMC of the memory cell array 111.

Reference signal generator 135 may generate a reference voltage or current and may provide the reference voltage or current to read/write circuit 120. Read/write circuit 120 may determine data provided by memory cell array 111 using the reference voltage or current provided by reference signal generator 136.

Reference signal generator 136 and read/write circuit 120 are illustrated in FIG. 7 as being separate from each other, but alternatively, reference signal generator 136 may be included in read/write circuit 120. Still alternatively, reference signal generator 136 and voltage generator 134 may be incorporated into a single element.

Pointer control circuit 137 may control a write pointer (wPtr of FIG. 11) of buffer 122. Pointer control circuit 137 may control the write pointer wPtr to sequentially point to first through N-th storage regions (1 through N of FIG. 11) of buffer 122 and may thus allow program data to be written to the first through N-th storage regions 1 through N. In response to new program data being provided when the write pointer wPtr points to the N-th storage region N, pointer control circuit 137 may control the write pointer wPtr to point again to first storage region 1 such that the new program data can be written to first storage region 1.

Comparison circuit 138 may compare data output by buffer 122 and data output by memory cell array 111. Specifically, comparison circuit 138 may read data from both buffer 122 and memory cell array 111 using the same address and may compare the data read from buffer 122 and the data read from memory cell array 111.

Comparison circuit 138 is illustrated in FIG. 7 as being separate from read/write circuit 120, but the present disclosure is not limited thereto. That is, alternatively, comparison circuit 138 may be included in read/write circuit 120. Still alternatively, comparison circuit 138 may be included in read circuit 124. Yet still alternatively, comparison circuit 138 may be included in memory controller 200 of FIG. 5.

Pointer control circuit 137 is illustrated as being separate from read/write circuit 120, but the present disclosure is not limited thereto. That is, alternatively, pointer control circuit 137 may be included in read/write circuit 120. Still alternatively, pointer control circuit 137 may be included in write circuit 126. Yet still alternatively, comparison circuit 138 may be included in buffer 122.

A read operation of a memory device according to some example embodiments of the present disclosure will hereinafter be described with reference to FIGS. 7 and 12.

Figure 12:
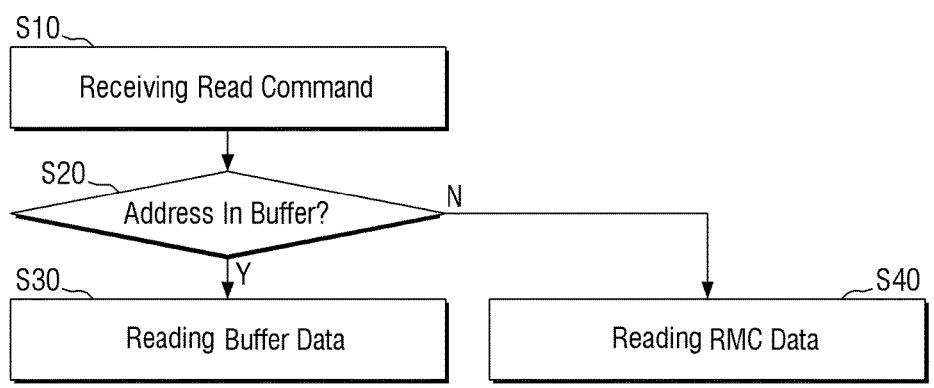
FIG. 12 is a flowchart illustrating a read operation of a memory device according to some example embodiments of the present disclosure.

FIG. 12 is a flowchart illustrating a read operation of a memory device according to some example embodiments of the present disclosure.

Referring to FIG. 12, a read command is received (S10). For example, memory element 100-1 may receive the read command and a read address from the memory controller 200 of FIG. 5. In response to the receipt of the read command and the read address, control circuit 130 of memory element 100-1 may prepare for a read operation using read/write circuit 120.

Thereafter, a determination is made as to whether the read address exists in a buffer (S20). For example, control circuit 130 may determine whether there exists the read address in any one of address areas 122a of buffer 122 by using read/write circuit 120. In some example embodiments, control circuit 130 may access one of the resistive memory cells RMC of memory cell array 111 with the read address by using read/write circuit 120.

Thereafter, in response to a determination being made that the read address exists in the buffer, a read operation is performed on the buffer (S30). For example, in response to a determination being made that the read address exists in one of address areas 122a of buffer 122, control circuit 130 may read data from a data area 122b of buffer 122 corresponding to address area 122a where the read address exists, by using read/write circuit 120.

On the other hand, in response to a determination being made that the read address does not exist in any one of address areas 122a of buffer 122, a read operation is performed on memory cell array 111 (S40). For example, control circuit 130 may read data from the resistive memory cell RMC that can be accessed with the read address, by using read/write circuit 120.

A write operation of a memory device according to some example embodiments of the present disclosure will hereinafter be described with reference to FIGS. 7 and 13 through 17.

Figure 13:
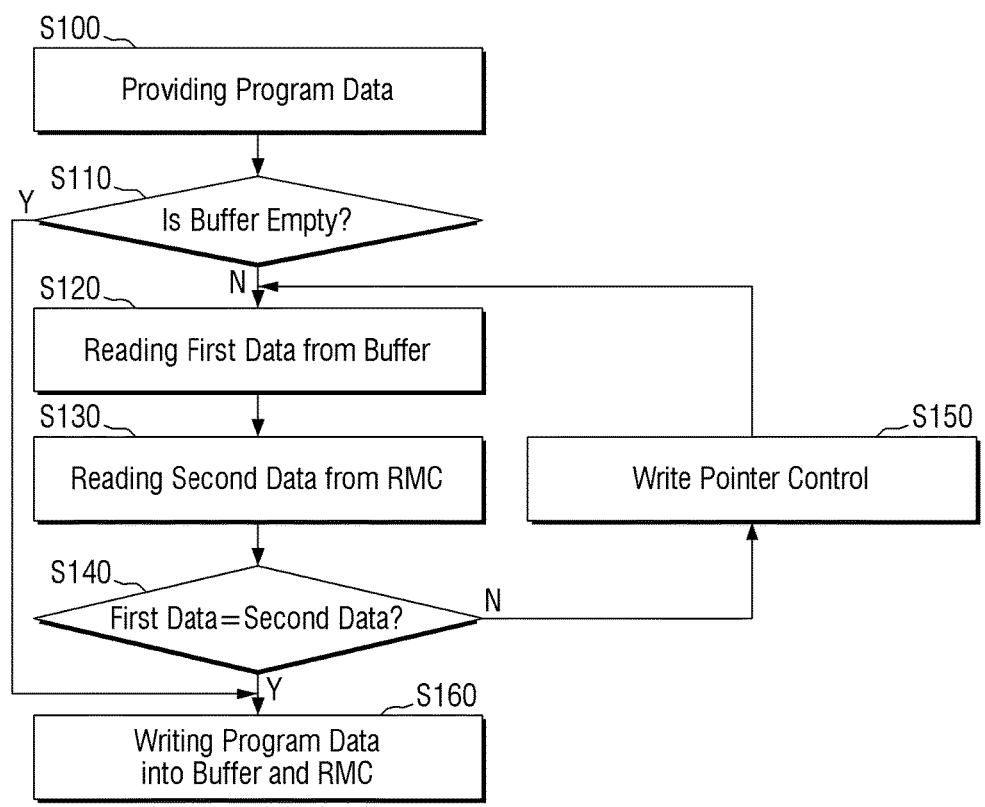
FIG. 13 is a flowchart illustrating a write operation of a memory device according to some example embodiments of the present disclosure.

FIG. 13 is a flowchart illustrating a write operation of a memory device according to some example embodiments of the present disclosure. FIGS. 14 through 17 illustrate the write operation of FIG. 13.

Referring to FIG. 13, program data is received (S100). For example, memory element 100-1 may receive a write command, a write address, and the program data from memory controller 200 of FIG. 5. In response to the receipt of the write command, the write address, and the program data, memory element 100-1 may prepare for a write operation using read/write circuit 120.

Thereafter, a determination is made as to whether a storage region of a buffer is empty (S110). In response to a determination being made that the storage region of the buffer is empty, the program data is written to both the buffer and a memory cell array (S160). Specifically, a determination is made as to whether there exists data previously stored in a storage region of buffer 122 pointed to by the write pointer wPtr, and in response to a determination being made that there exists no data in the storage region of buffer 122 pointed to by the write pointer wPtr, the program data may be written to both buffer 122 and memory cell array 111.

Figure 14:
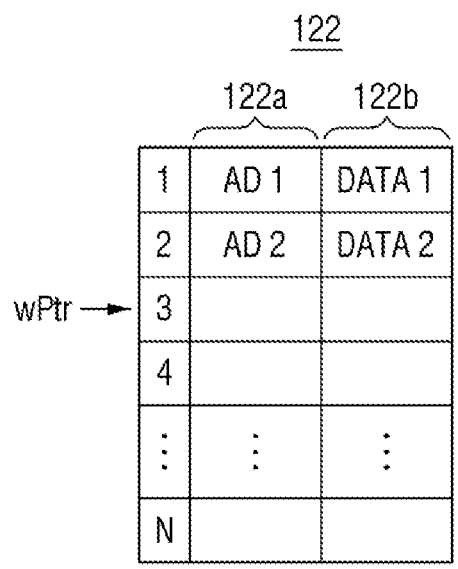
FIGS. 14, 15, 16 and 17 illustrate the write operation of FIG. 13.

For example, referring to FIG. 14, in response to the write command, the write address, and the program data being received from memory controller 200 of FIG. 5 when the write pointer wPtr of buffer 122 points to third storage region 3 of buffer 122, control circuit 130 may write the write address and the program data to an address area 122a and a data area 122b, respectively, of third storage region 3 of buffer 122 by using read/write circuit 120. Also, control circuit 130 may write the program data to a resistive memory cell RMC of memory cell array 111 that can be accessed with the write address.

On the other hand, in response to a determination being made that the buffer is not empty (S110), then first data is read from the buffer (S120). Specifically, in response to there existing data previously stored in the storage region of buffer 122 pointed to by the write pointer wPtr, the first data may be read from the storage region of buffer 122 pointed to by the write pointer wPtr.

Figure 15:
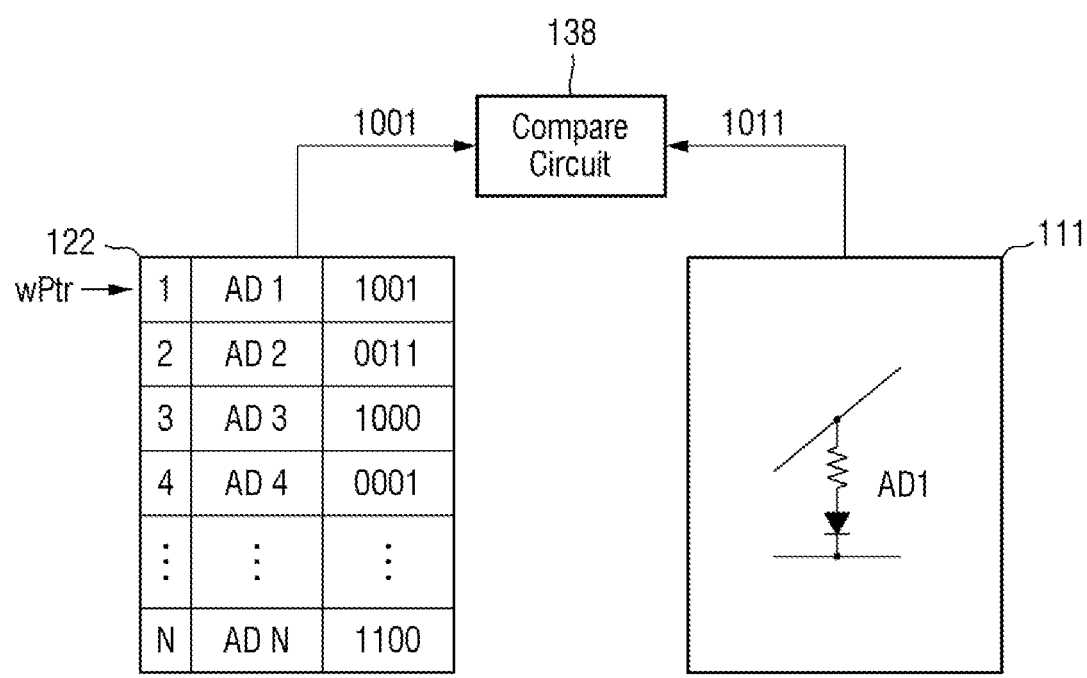

For example, referring to FIG. 15, in response to the write command, the write address, and the program data being received from memory controller 200 of FIG. 5 when the write pointer wPtr of buffer 122 points to first storage region 1, control circuit 130 may read data previously stored in first storage region 1 of buffer 122 by using read/write circuit 120. In this example, since the first data "1001" is stored in first storage region 1, the first data "1001" may be output.

The first data "1001" is just an example, and the unit of data that can be stored in buffer 122 may vary. That is, alternatively, a page, which is the unit of data, may be stored in first storage region 1 of buffer 122.

Thereafter, second data is read from the memory cell array (S130). Specifically, the second data may be read from a resistive memory cell RMC of memory cell array 111 that can be accessed with an address stored in the storage region of buffer 122 pointed to by the write pointer wPtr.

For example, referring to FIG. 15, in response to the write command, the write address, and the program data being received from memory controller 200 of FIG. 5 when the write pointer wPtr of buffer 122 points to first storage region 1 of buffer 122, control circuit 130 may read the second data from a resistive memory cell RMC of memory cell array 111 that can be accessed with an address "AD1". Since the second data "1011" is stored in the resistive memory cell RMC of memory cell array 111 that can be accessed with the address "AD1", the second data "1011" is output.

Thereafter, the first data read from the first storage region of the buffer and the second data read from the memory cell array are compared to determine whether they are identical (S140). In response to the first data read from the first storage region of the buffer and the second data read from the memory cell array not being identical, a write pointer of the buffer is controlled (S150).

For example, referring to FIG. 15, comparison circuit 138 may compare the first data "1001" read from the second storage region of buffer 122 and the second data "1011" read from memory cell array 111 to determine whether the first data "1001" and the second data "1011" are identical. Since the first data "1001" and the second data "1011" are not identical, control circuit 130 or pointer control circuit 137 may control the write pointer wPtr of buffer 122 to point to a second storage region 2 of buffer 122. Then, new first data (also referred to as third data) is read from the second storage region of the buffer (S120), and new second data (also referred to as fourth data) is read from the memory cell array (S130), and the new first data read from the second storage region of the buffer and the new second data read from the memory cell array are compared to determine whether they are identical (S140).

Figure 16:
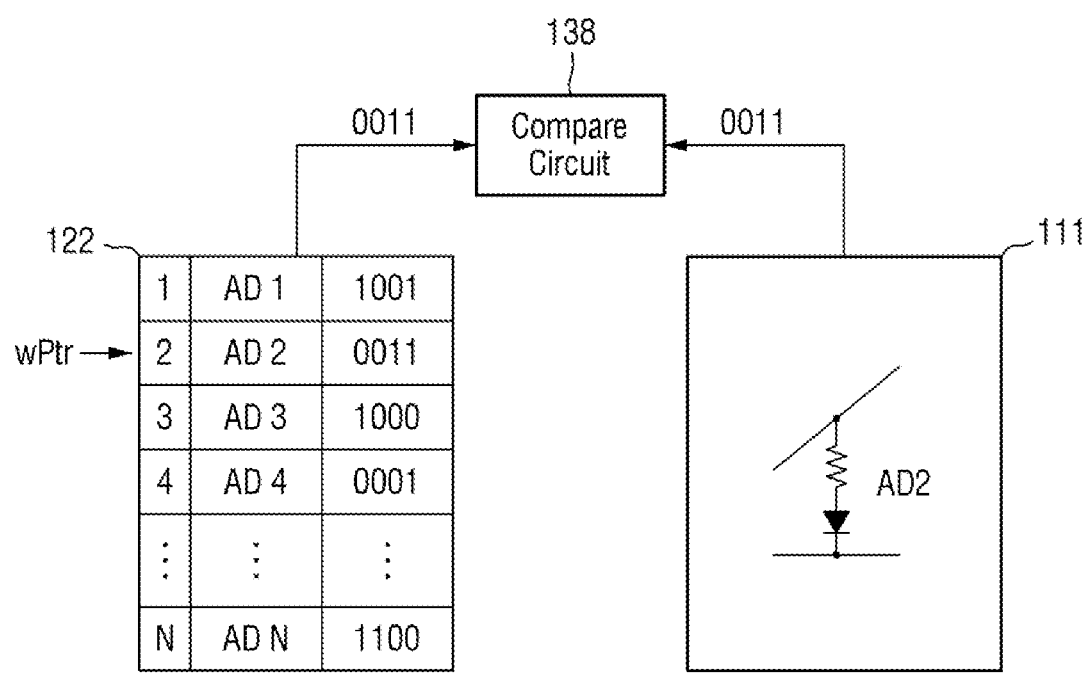
Figure 17:
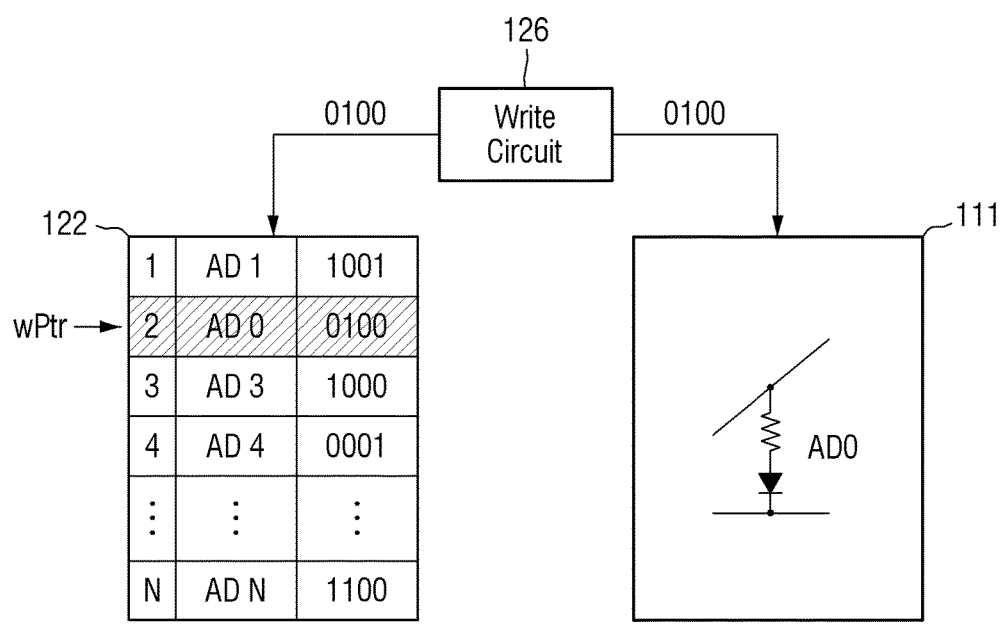

For example, referring to FIG. 16, comparison circuit 138 may compare the new first data "0011" read from second storage region of buffer 122 and the new second data "0011" read from a resistive memory cell RMC of memory cell array 111 that can be accessed with an address "AD2" to determine whether the new first data "0011" and the new second data "0011" are identical.

Thereafter, the new first data read from the second storage region of the buffer and the new second data read from the memory cell array are compared to determine whether they are identical (S140). In response to the new first data read from the second storage region of the buffer and the new second data read from the memory cell array being identical, the program data is written to both the second storage region of the buffer and the memory cell array (S160).

For example, referring to FIG. 16, comparison circuit 138 may compare the new first data "0011" read from buffer 122 and the new second data "0011" read from memory cell array 111 to determine whether the new first data "0011" and the new second data "0011" are identical. Since the new first data "0011" and the new second data "0011" are identical, control circuit 130 may write a write address "AD0" and program data "0100" to second storage region 2 of buffer 122 by using the read/write circuit 120 or write circuit 126. Also, referring to FIG. 17, control circuit 130 may write the program data "0100" to a resistive memory cell RMC of memory cell array 111 that can be accessed with the write address "AD0" by using read/write circuit 120 or write circuit 126. The operations S120 through S160 described above may be considered to define an embodiment of a method wherein a control circuit is configured to receive program data to be programmed to the memory cell array, to compare first data stored in a first storage region of the buffer and second data stored in a first resistive memory cell of the memory cell array, and in response to comparing the first data and the second data to determine one of the first storage region and a second storage region of the buffer as a selected storage region to which to write the program data.

Figure 18:
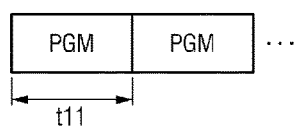
FIGS. 18, 19 and 20 illustrate the benefits of a memory device according to some example embodiments of the present disclosure.
Figure 18:
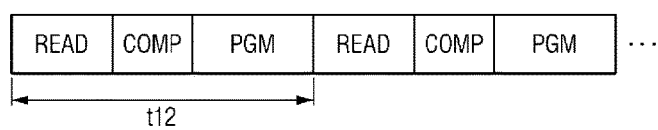
Figure 18:
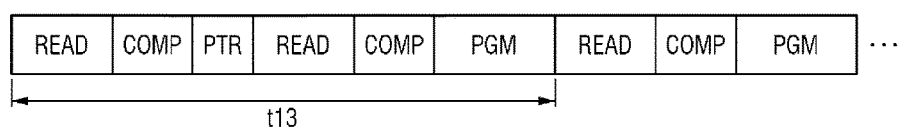
Figure 19:
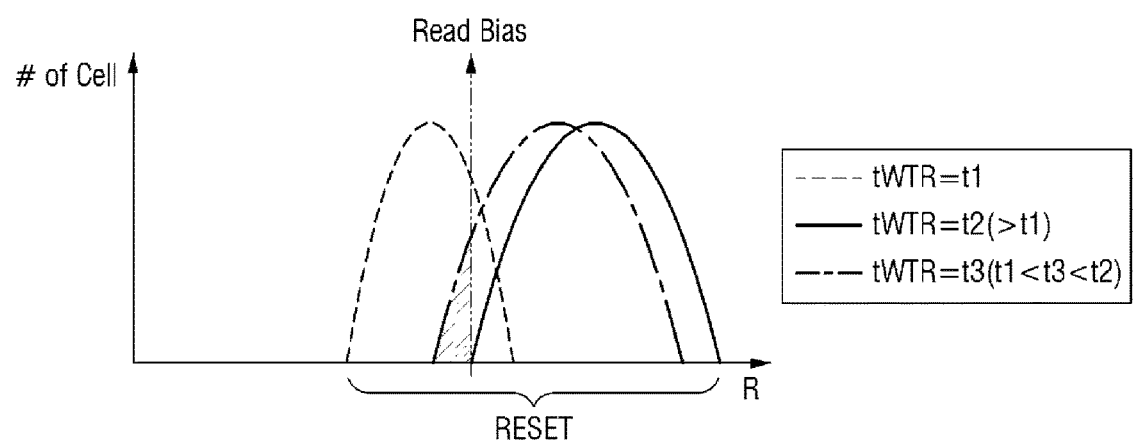
Figure 20:
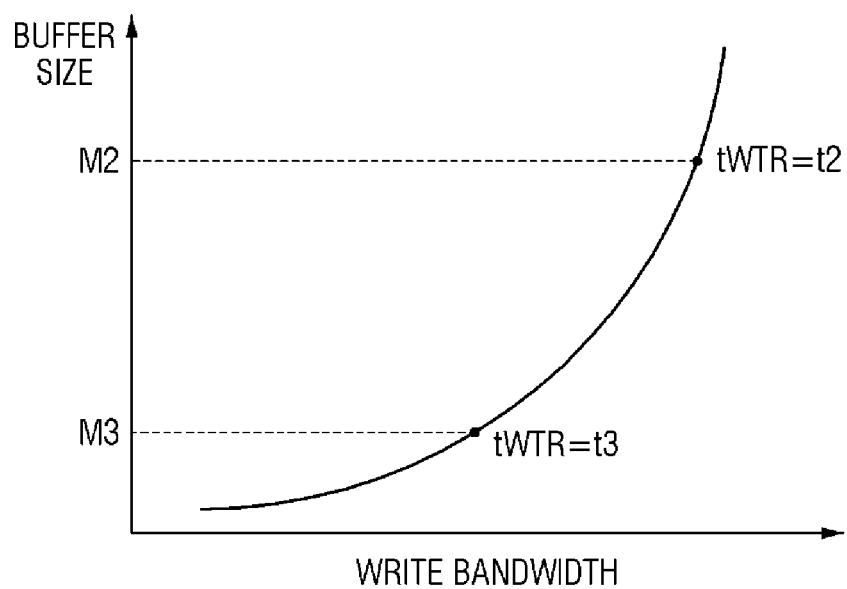

FIGS. 18 through 20 illustrate the benefits of a memory device and method according to some example embodiments of the present disclosure.

Referring to FIG. 18, the amount of time that it takes to perform a write operation using a buffer capable of securing a stabilization time tWTR which is as long as t2 may be t11.

The amount of time that it takes to perform a write operation using a buffer capable of securing a stabilization time tWTR which is as long as t3 (where t3<t2) may be t12 or t13.

A first case "Case 1" in which the amount of time required to perform a write operation is t12 is a case in which the same data is stored in both a storage region of buffer 122 pointed to by the write pointer wPtr and a resistive memory cell RMC of memory cell array 111 corresponding to the storage region of buffer 122 pointed to by the write pointer wPtr, as illustrated in FIG. 16. That is, the first case "Case 1" is a case in which a sufficient stabilization time tWTR has already been secured so that a write operation can no longer be affected by a resistance drift phenomenon, even if the data stored in the storage region of buffer 122 pointed to by the write pointer wPtr is reset data.

A second case "Case 2" in which the amount of time required to perform a write operation is t13 is a case in which the data stored in the storage region of buffer 122 pointed to by the write pointer wPtr and the data stored in the resistive memory cell RMC of memory cell array 111 corresponding to the storage region of buffer 122 pointed to by the write pointer wPtr are not identical, as illustrated in FIG. 15. That is, as described above, the write pointer wPtr needs to be moved at least once, and then, a read operation and a comparison operation for comparing data read from buffer 122 and data read from memory cell array 111 need to be additionally performed.

The second case "Case 2" in which the amount of time required to perform a write operation is t13 corresponds to a hatched region of FIG. 19 and occurs in only a few resistive memory cells RMC. That is, the second case "Case 2" in which the amount of time required to perform a write operation is t13 corresponds to a tail of a memory cell distribution obtained by reducing the buffer size from a size which is capable of securing a stabilization time tWTR which is as long as t2 to a size which is only capable of securing a stabilization time tWTR which is as long as t3<t2. Thus, the second case "Case 2" in which the amount of time required to perform a write operation is t13 rarely occurs during a write operation.

It takes more time to perform a read operation and a comparison operation in the first case "Case 1" in which the amount of time required to perform a write operation is t12 than in a case in which the amount of time required to perform a write operation is t11. However, referring to FIG. 20, if buffer size is reduced from a size M2 which is capable of securing a stabilization time tWTR which is as long as t2 to a size M3 which is only capable of securing a stabilization time tWTR which is as long as t3<t2, while maintaining the same write bandwidth, the effect of the reduction of the area occupied by the buffer may be considerable.

Thus, it is possible to realize a small-size memory device capable of operating at high speed while maintaining any given write bandwidth, and also capable of securing the reliability of read and write operations.

Figure 21:
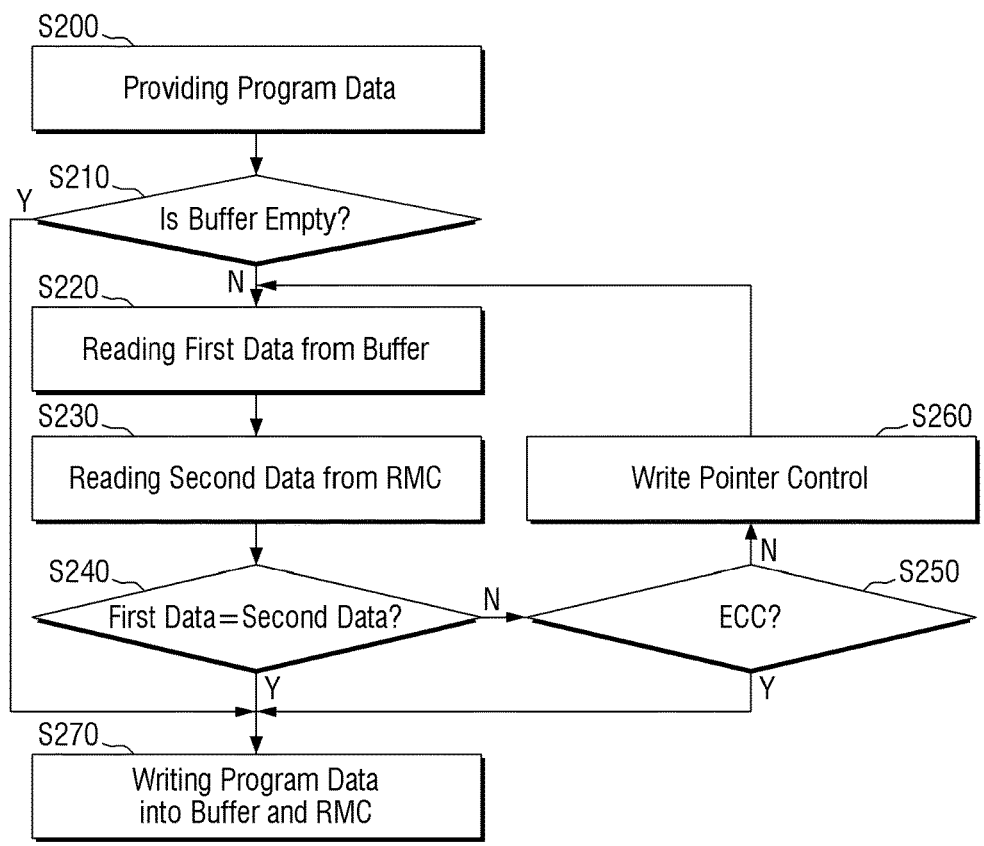
FIG. 21 is a flowchart illustrating a write operation of a memory device according to some example embodiments of the present disclosure.

FIG. 21 is a flowchart illustrating a write operation of a memory device according to some example embodiments of the present disclosure.

Referring to FIG. 21, program data is received (S200), a determination is made as to whether a storage location of a buffer is empty (S210), data is read from the buffer (S220), and data is read from a memory cell array (S230). Operations S200, S210, S220, and S230 are substantially the same as their respective counterparts of FIG. 13, and thus, detailed descriptions thereof will be omitted.

Thereafter, the first data read from the buffer and the second data read from the memory cell array are compared to determine whether they are identical (S240). In response to the first data read from the buffer and the second data read from the memory cell array not being identical, a determination is made as to whether the first data read from the buffer and the second data read from the memory cell array can be made identical through error detection and correction (S250).

That is, in the example embodiment of FIG. 21, the first data read from the buffer and the second data read from the memory cell array are determined to be identical if a determination is made that the first data read from the buffer and the second data read from the memory cell array can be made identical through error detection and correction. Thus, in response to a determination being made that the first data read from the buffer and the second data read from the memory cell array can be made identical through error detection and correction, program data is written to the buffer and the memory cell array (S270). On the other hand, in response to a determination being made that the first data read from the buffer and the second data read from the memory cell array cannot be made identical through error detection and correction, a write pointer of the buffer is controlled (S260). Operations S260 and S270 are substantially the same as their respective counterparts of FIG. 13, and thus, detailed descriptions thereof will be omitted.

Figure 22:
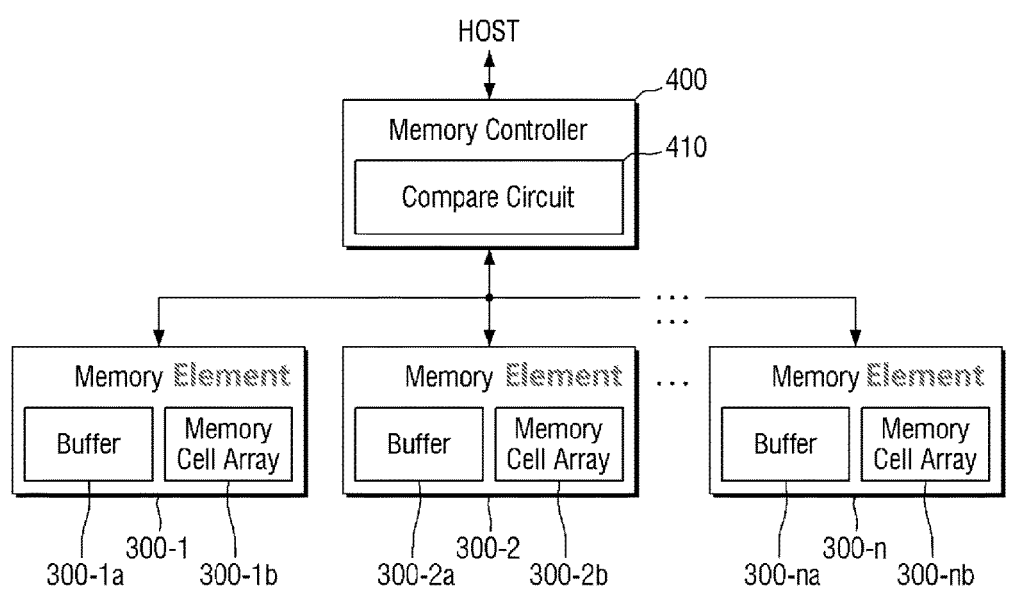
FIG. 22 is a block diagram of a memory device according to some example embodiments of the present disclosure.

FIG. 22 is a block diagram of a memory device according to some example embodiments of the present disclosure.

Referring to FIG. 22, the memory device may include a memory controller 400 and a plurality of memory elements 300-1 through 300-n.

Memory controller 400 may include a comparison circuit 410, which performs a similar operation to that of comparison circuit 138 of FIG. 7 on memory elements 300-1 through 300-n. Memory elements 300-1 through 300-n may include buffers 300-1a through 300-na, respectively, and memory cell arrays 300-1b through 300-nb, respectively.

Figure 23:
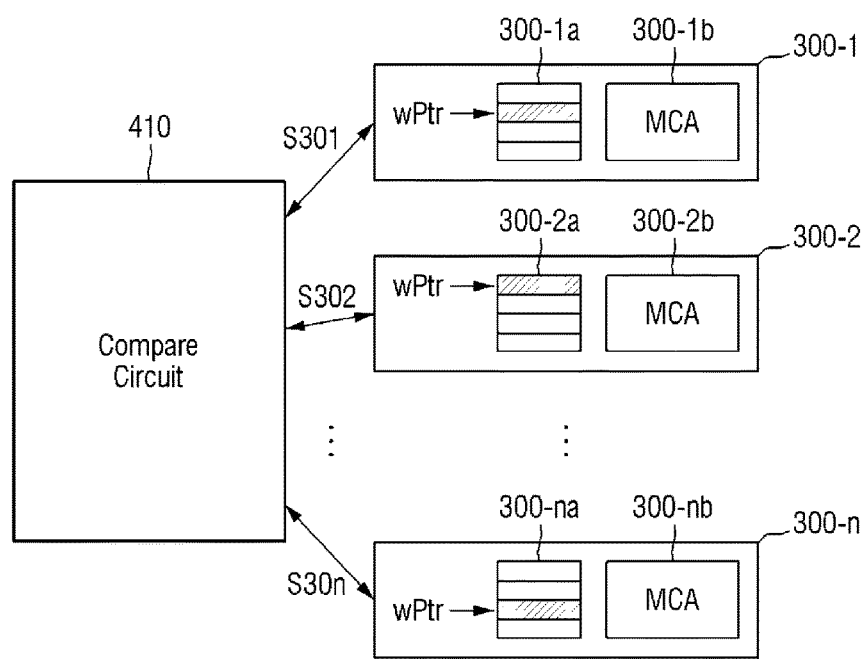
FIG. 23 illustrates an example of the operation of the memory device of FIG. 22.

FIG. 23 illustrates an example of the operation of the memory device of FIG. 22.

Referring to FIG. 23, comparison circuit 410 may perform a comparison operation that has been described above on memory elements 300-1 through 300-n. For example, comparison circuit 410 may read data from a storage region of buffer 300-1a of memory element 300-1 pointed to by a write pointer wPtr of memory element 300-1 and a resistive memory cell of memory cell array 300-1b corresponding to the storage region of buffer 300-1a pointed to by the write pointer wPtr of memory element 300-1, and may compare the data read from the storage region of buffer 300-1a of memory element 300-1 pointed to by the write pointer wPtr of memory element 300-1 and the data read from the resistive memory cell of memory cell array 300-1b corresponding to the storage region of buffer 300-1a pointed to by the write pointer wPtr of memory element 300-1 (S301). If the data read from the storage region of buffer 300-1a of memory element 300-1 pointed to by the write pointer wPtr of memory element 300-1 and the data read from the resistive memory cell of memory cell array 300-1b corresponding to the storage region of buffer 300-1a pointed to by the write pointer wPtr of memory element 300-1 are identical, program data may be written to both buffer 300-1a and memory cell array 300-1b of memory element 300-1 (S301).

On the other hand, if the data read from the storage region of buffer 300-1a of memory element 300-1 pointed to by the write pointer wPtr of memory element 300-1 and the data read from the resistive memory cell of memory cell array 300-1b corresponding to the storage region of buffer 300-1a pointed to by the write pointer wPtr of memory element 300-1 are not identical, comparison circuit 410 may read data from a storage region of buffer 300-2a of memory element 300-2 pointed to by a write pointer wPtr of memory element 300-2 and a resistive memory cell of memory cell array 300-2b corresponding to the storage region of buffer 300-2a pointed to by the write pointer wPtr of memory element 300-2, and may compare the data read from the storage region of buffer 300-2a of memory element 300-2 pointed to by the write pointer wPtr of memory element 300-2 and the data read from the resistive memory cell of memory cell array 300-2b corresponding to the storage region of buffer 300-2a pointed to by the write pointer wPtr of memory element 300-2 (S302). If the data read from the storage region of buffer 300-2a of memory element 300-2 pointed to by the write pointer wPtr of memory element 300-2 and the data read from the resistive memory cell of memory cell array 300-2b corresponding to the storage region of buffer 300-2a pointed to by the write pointer wPtr of memory element 300-2 are identical, the program data may be written to both buffer 300-2a and memory cell array 300-2b of memory element 300-2 (S302).

Comparison circuit 410 may continue to perform the aforementioned comparison operation until the comparison of data read from a storage region of buffer 300-na pointed to by a write pointer wPtr of memory element 300-n and data read from a resistive memory cell of memory cell array 300-nb corresponding to the storage region of buffer 300-na pointed to by the write pointer wPtr of memory element 300-n is completed (S30n).

While example embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further example embodiments of the present disclosure.

What is claimed is:

1. A memory device, the memory device comprising:
a memory cell array including at least a first resistive memory cell and a second resistive memory cell, wherein the first resistive memory cell and the second resistive memory cell each include a resistance change material and each are configured to store different data according to a value of their resistance;
a buffer including a first storage region and a second storage region corresponding to the first resistive memory cell and the second resistive memory cell, respectively; and
a control circuit configured to receive program data to be programmed to the memory cell array, to compare first data stored in the first storage region and second data stored in the first resistive memory cell, and in response to comparing the first data and the second data to determine one of the first storage region and the second storage region as a selected storage region to which to write the program data.

2. The memory device of claim 1, wherein the control circuit is configured to write the program data to the first storage region when the first data and the second data are identical, and to write the program data to the second storage region when the first data and the second data are not identical.

3. The memory device of claim 1, further comprising:
an Error Correction Code (ECC) unit configured to perform error detection and correction on the second data stored in the memory cell array, wherein the control circuit is configured to write the program data to the first storage region it is determined that the first data and the second data can be made identical through error detection and correction, and to write the program data to the second storage region when it is determined that the first data and the second data cannot be made identical through error detection and correction.

4. The memory device of claim 1, wherein
the control circuit includes a pointer control circuit which is configured to control a write pointer pointing to a target storage region to which to write the program data, and
the pointer control circuit is further configured to control the write pointer to change the target storage region to which to write the program data according to a result of comparing the first data and the second data.

5. The memory device of claim 1, wherein the memory cell array, the buffer and the control circuit comprise a memory element, the memory device further comprising a memory controller configured to provide the program data and a write command to the memory element.

6. The memory device of claim 1, wherein
the first resistive memory cell and the first storage region are disposed in a first memory element, and
the second resistive memory cell and the second storage region are disposed in a second memory element which is different from the first memory element,
the memory device further comprising a memory controller which is configured to provide the program data and a write comment to the first memory element and the second memory element.

7. The memory device of claim 1, wherein the first resistive memory cell and the second resistive memory cell each include a variable resistance element, which comprises a phase-change material, and an access element, which controls a current that flows in the variable resistance element.

8. The memory device of claim 7, wherein the access element includes an Ovonic Threshold Switch (OTS).

9. A method of operating a memory device, comprising:
receiving program data;
reading first data stored in a first storage region of a buffer of the memory device, wherein the first storage region is pointed to by a write pointer;
reading second data stored in a first resistive memory cell of the memory device, which corresponds to the first storage region and stores different data according to a value of its resistance;
comparing the first data and the second data; and
writing the program data to the first storage region when comparing the first data and the second data produces a first result, and controlling the write pointer to point to a second storage region of the buffer, which is different from the first storage region, when comparing the first data and the second data produces a second result, which is different from the first result.

10. The method of claim 9, further comprising:
controlling the write pointer to point to the second storage region;
comparing third data stored in the second storage region and fourth data stored in a second resistive memory cell, which corresponds to the second storage region; and
writing the program data to the second storage region when the result of the comparing the third data and the fourth data, is the first result, and controlling the write pointer to point to a third storage region of the buffer, which is different from the first and second storage regions, when the result of the comparing the third data and the fourth data is the second result.

11. The method of claim 9, wherein the first storage region and the first resistive memory cell are indicated by a same address.

12. The method of claim 9, wherein
the first result includes a first case in which the first data and the second data are identical, and
the second result includes a second case in which the first data and the second data are not identical.

13. The method of claim 9, wherein
the first result includes a case in which the first data and the second data can be made identical through error detection and correction.

14. The method of claim 9, further comprising:
providing a read command; and
in response to the read command, outputting read data from one of the buffer and a memory cell array including the first resistive memory cell.

15. The method of claim 14, wherein
providing the read command includes providing a read address, and
outputting the read data comprises outputting the read data from the buffer when the read address exists in the buffer, and outputting the read data from the memory cell array when the read address does not exist in the buffer.

16. A method of operating a memory device, comprising:
receiving program data;
reading first data stored in a first storage region of a buffer of the memory device, wherein the buffer includes the first storage region and a second storage region separate from the first storage region;
reading second data stored in a first resistive memory cell of a memory cell array of the memory device, wherein the first resistive memory cell corresponds to the first storage region and stores different data according to a value of its resistance;
comparing the first data and the second data; and
writing the program data to the first storage region when comparing the first data and the second data produces a first result, and writing the program data to the second storage region when comparing the first data and the second data produces a second result which is different from the first result.

17. The method of claim 16, wherein
the first storage region and the second storage region are disposed in a single memory element of the memory device, and
the first resistive memory cell and a second resistive memory cell are also disposed in the single memory element.

18. The method of claim 16, wherein
the first storage region and the first resistive memory cell are disposed in a first memory element of the memory device, and
the second storage region and a second resistive memory cell of the memory device are disposed in a second memory element of the memory device, which is different from the first memory element.

19. The method of claim 16, wherein
the first storage region and the first resistive memory cell are indicated by a first same address as each other, and the second storage region and a second resistive memory cell of the memory device are indicated by a second same address as each other.

20. The operating method of claim 16, wherein
the first result includes a first case in which the first data and the second data are identical, and
the second result includes a second case in which the first data and the second data are not identical.

* * * * *